US 7,892,916 B2

(12) United States Patent
Takamatsu et al.

(10) Patent No.: US 7,892,916 B2
(45) Date of Patent: Feb. 22, 2011

(54) SEMICONDUCTOR DEVICE AND FABRICATING METHOD THEREOF

(75) Inventors: Tomohiro Takamatsu, Kawasaki (JP); Mitsushi Fujiki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 679 days.

(21) Appl. No.: 11/093,146

(22) Filed: Mar. 30, 2005

(65) Prior Publication Data

US 2006/0118847 A1 Jun. 8, 2006

(30) Foreign Application Priority Data

Dec. 3, 2004 (JP) ............................. 2004-351904

(51) Int. Cl.
*H01L 21/8242* (2006.01)
(52) U.S. Cl. .................... 438/239; 438/3; 257/E21.008
(58) Field of Classification Search ................ 438/239, 438/253, 396, 238, 240, 3; 257/E21.009, 257/E21.008, E21.011, E21.013
See application file for complete search history.

(56) References Cited

U.S. PATENT DOCUMENTS

| 4,857,689 | A * | 8/1989 | Lee ............................. 219/650 |
| 5,864,153 | A * | 1/1999 | Nagel et al. .................. 257/296 |
| 6,190,957 | B1 * | 2/2001 | Mochizuki et al. ........... 438/240 |
| 6,259,126 | B1 * | 7/2001 | Hsu et al. .................... 257/298 |
| 6,281,023 | B2 * | 8/2001 | Eastep et al. ..................... 438/3 |
| 6,326,258 | B1 * | 12/2001 | Iizuka ......................... 438/239 |
| 6,531,726 | B1 * | 3/2003 | Takamatsu ................... 257/295 |
| 6,720,603 | B2 * | 4/2004 | Iijima et al. .................. 257/303 |
| 6,812,510 | B2 | 11/2004 | Horii et al. |
| 6,815,221 | B2 * | 11/2004 | Kim et al. ....................... 438/3 |
| 6,825,515 | B2 | 11/2004 | Takamatsu |
| 7,091,541 | B2 * | 8/2006 | Natsume et al. ............. 257/301 |
| 2002/0008475 | A1 * | 1/2002 | Yoshioka et al. ............ 313/586 |
| 2002/0074601 | A1 * | 6/2002 | Fox et al. ..................... 257/350 |
| 2002/0076878 | A1 * | 6/2002 | Won et al. .................... 438/239 |
| 2002/0149040 | A1 * | 10/2002 | Sun et al. ..................... 257/295 |
| 2003/0036239 | A1 * | 2/2003 | Lim et al. .................... 438/381 |
| 2003/0112578 | A1 * | 6/2003 | Shaw et al. ............... 361/301.2 |

(Continued)

FOREIGN PATENT DOCUMENTS

JP 2001-127262 A 5/2001

(Continued)

OTHER PUBLICATIONS

Korean Office Action dated Jan. 31, 2007, issue in corresponding Korean Application No. 2005-27168.

(Continued)

*Primary Examiner*—Matthew C Landau
*Assistant Examiner*—Latanya Crawford
(74) *Attorney, Agent, or Firm*—Westerman, Hattori, Daniels & Adrian, LLP

(57) ABSTRACT

An upper electrode layer is processed into plural electrode shapes with lithography and subsequent dry etching to pattern plural upper electrodes, followed by conducting an RTA treatment at a treatment temperature of a value in a range from 400° C. to 1000° C. and at an oxygen flow volume of a value in a range from 0.1 L/min to 100 L/min and, subsequently, by conducting an annealing treatment at a treatment temperature of 650° C. in an oxygen atmosphere for 60 minutes.

11 Claims, 17 Drawing Sheets

U.S. PATENT DOCUMENTS

| | | |
|---|---|---|
| 2003/0122176 A1 | 7/2003 | Takamatsu |
| 2003/0157766 A1* | 8/2003 | Uchiyama et al. ............ 438/240 |
| 2003/0162394 A1 | 8/2003 | Takemura |
| 2003/0213986 A1* | 11/2003 | Takamatsu et al. .......... 257/295 |
| 2003/0230773 A1 | 12/2003 | Horii et al. |
| 2004/0018678 A1* | 1/2004 | Chung et al. ................. 438/239 |
| 2004/0102015 A1* | 5/2004 | Choi et al. ................... 438/396 |
| 2004/0224180 A1* | 11/2004 | Kijima et al. ................ 428/611 |

FOREIGN PATENT DOCUMENTS

| | | |
|---|---|---|
| JP | 2001-210807 | 8/2001 |
| JP | 2001-332514 A | 11/2001 |
| JP | 2002-057297 | 2/2002 |
| JP | 2002-110934 * | 4/2002 |
| JP | 2002110934 A * | 4/2002 |
| JP | 2002-203914 | 7/2002 |
| JP | 2002-246564 | 8/2002 |
| JP | 2003-197874 A | 7/2003 |
| JP | 2003-258202 A | 9/2003 |
| JP | 2004-22702 A | 1/2004 |
| KR | 2002-0049389 | 6/2002 |
| KR | 2003-0060253 | 7/2003 |

OTHER PUBLICATIONS

Japanese Office Action mailed Oct. 20, 2009, issued in corresponding Japanese Application No. 2004-351904.

* cited by examiner

UPPER ELECTRODE OCCUPYING AREA
PERCENTAGE 20%

UPPER ELECTRODE OCCUPYING AREA
PERCENTAGE 0.03%

BEFORE ANNEALING TREATMENT

AFTER RTA TREATMENT AT 650°C
FOR 1 MINUTE

ONLY WITH A HORIZONTAL FURNACE (ref.)

RTA 650°C 1MIN ⇒ HORIZONTAL FURNACE 650°C

RTA 700°C 1MIN ⇒ HORIZONTAL FURNACE 650°C

FIG. 10A

| ELEMENT | BINDING ENERGY | ATOM % |
| --- | --- | --- |
| O (1s) | 532.0 | 49.00 |
| Ti (2p) | 460.0 | 0.36 |
| C (1s) | 285.0 | 31.49 |
| Cl (2p) | 199.0 | 0.63 |
| Zr (3d) | 184.0 | 0.79 |
| Pb (4f) | 139.0 | 0.54 |
| Ir (4f) | 66.0 | 17.19 |

FIG. 10B

| ELEMENT | BINDING ENERGY | ATOM % |
| --- | --- | --- |
| O (1s) | 532.0 | 49.00 |
| Ti (2p) | 460.0 | 0.36 |
| C (1s) | 285.0 | 31.49 |
| Cl (2p) | 199.0 | 0.63 |
| Zr (3d) | 184.0 | 0.79 |
| Pb (4f) | 139.0 | 0.54 |
| Ir (4f) | 66.0 | 17.19 |

FIG. 11A

| ELEMENT | BINDING ENERGY | ATOM % |
|---|---|---|
| O (1s) | 530.0 | 41.51 |
| Ti (2p) | 453.0 | 0.05 |
| C (1s) | 285.0 | 33.89 |
| Cl (2p) | 198.0 | 0.66 |
| Zr (3d) | 181.0 | 0.36 |
| Pb (4f) | 138.0 | 5.91 |
| Ir (4f) | 65.0 | 17.63 |

FIG. 11B

| ELEMENT | BINDING ENERGY | ATOM % |
|---|---|---|
| O (1s) | 531.0 | 54.79 |
| Ti (2p) | 452.0 | 0.33 |
| C (1s) | 285.0 | 19.42 |
| Cl (2p) | 198.0 | 0.67 |
| Zr (3d) | 183.0 | 0.90 |
| Pb (4f) | 138.0 | 0.70 |
| Ir (4f) | 65.0 | 19.18 |

700°C—2SLM

700°C—10SLM

700°C—8SLM

750°C—8SLM

SEMICONDUCTOR DEVICE AND FABRICATING METHOD THEREOF

CROSS-REFERENCE TO RELATED APPLICATIONS

This application is based upon and claims the benefit of priority from the prior Japanese Patent Application No. 2004-351904, filed on Dec. 3, 2004, the entire contents of which are incorporated herein by reference.

BACKGROUND OF THE INVENTION

1. Field of the Invention

The present invention relates to a semiconductor device with a dielectric capacitor configuration configured by sandwiching a dielectric film between a lower electrode and an upper electrode and a fabricating method thereof, which is applied suitably, in particular, to a ferro-electric memory whose dielectric capacitor configuration has a dielectric film consisting of a material containing a ferro-electric substance.

2. Description of the Related Art

Conventionally, a flash memory and a ferro-electric random access memory (FeRAM) are known as a nonvolatile memory from which stored information does not disappear when the power is interrupted.

The flash memory has a floating gate mounted in a gate insulating film of an insulated gate field-effect transistor (IGFET), and stores information by accumulating charges representing information to be stored in the floating gate. In order to write or eliminate information, it is necessary to flow tunneling current that passes through the insulating film. Thus, a comparatively high voltage is required.

The FeRAM stores information by utilizing hysteresis characteristics of a ferro-electric substance. A ferro-electric capacitor configuration with a ferro-electric film as a dielectric substance between a pair of electrodes generates polarization in response to applied voltages between the electrodes, and has spontaneous polarization when the applied voltage is removed. When polarity of the applying voltage is reversed, polarity of the spontaneous polarization is also reversed. By detecting the spontaneous polarization, information can be read out. The FeRAM has such advantages that it is operated with a low voltage compared with a flash memory and makes a high-speed write-in possible while saving electric power consumption. A system on chip (SOC), in which a FeRAM is adopted to conventional logic technique, is examined for applications such as an IC card.

Refer to Japanese Patent Application Laid-open Nos. 2002-57297, 2002-246564 and 2001-210807.

Upon fabricating a FeRAM, in order to restore damage of a ferro-electric film generated when an upper electrode layer is formed on the ferro-electric film, or when the upper electrode is patterned by processing the upper electrode layer, it is necessary to apply heat treatment (annealing treatment) after the upper electrode is patterned. However, the annealing treatment sometimes causes generation of surface roughness on the upper electrode. Caused by the surface roughness as the primary reason, there are such problems as instability of contact of the upper electrode and generation of short circuit between the upper electrodes to lower process yield.

SUMMARY OF THE INVENTION

The present invention was achieved with the view of the aforementioned problems. The object of the invention is to provide a semiconductor device whose surface roughness at the upper electrode of a capacitor configuration is suppressed to realize a highly reliable capacitor configuration, while ensuring a superior capacitor characteristics; and a fabricating method thereof.

The fabricating method of a semiconductor device of the invention is a fabricating method of a semiconductor device comprising a semiconductor substrate, a transistor configuration formed on the semiconductor substrate and a capacitor configuration configured by sandwiching a dielectric film consisting of a material containing a ferro-electric substance with a lower electrode and an upper electrode, comprising the steps of patterning the upper electrode on the lower electrode via the dielectric film; performing a first heat treatment by rapid heating in the state in which the upper electrode has been formed on the dielectric film; and performing a second heat treatment with a longer period of time than the first heat treatment after the first heat treatment, upon forming the capacitor configuration.

The semiconductor device of the invention comprises a semiconductor substrate, a transistor configuration formed on the semiconductor substrate, and a capacitor configuration configured by sandwiching a dielectric film consisting of a material containing a ferro-electric substance with a lower electrode and an upper electrode, wherein crystal diameters of the upper electrode are 50 nm or less.

BRIEF DESCRIPTION OF THE DRAWINGS

FIGS. 10A and 10B are drawings showing the result of examining surface composition of the upper electrode with XPS.

FIGS. 11A and 11B are drawings showing the result of examining surface composition of the upper electrode with XPS.

DETAILED DESCRIPTION OF THE PREFERRED EMBODIMENTS

Fundamental Outline of the Invention

The present inventor arrived at an idea of practicing an annealing treatment of two steps differing in treatment time and the like in order to suppress surface roughness at an upper electrode of a ferro-electric capacitor configuration while ensuring superior capacitor characteristics, upon forming a ferro-electric capacitor configuration. Hereinafter, regarding the annealing treatment of two steps, superiority based on experimental proofs, optimum conditions, and an especially effective application range will be considered.

(Superiority of the Invention Based on Experimental Proofs)

Here, in order to conduct experiments for proofing superiority of the invention, following samples were prepared.

Figure 1A:
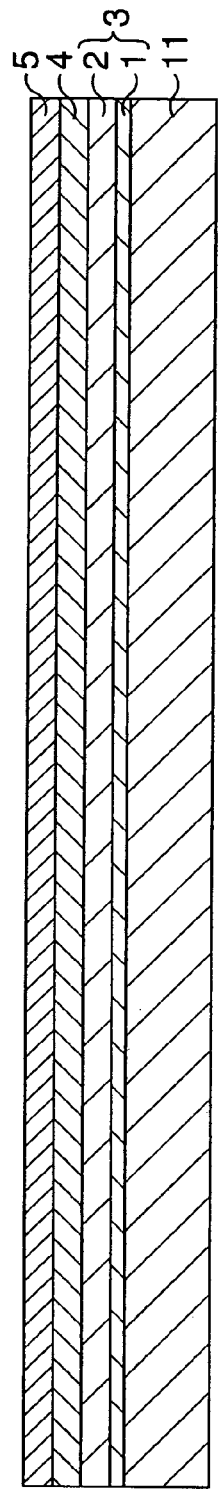
FIGS. 1A and 1B are schematic cross-sectional views showing steps of preparing samples for use in conducting experiments to exemplify superiority of the invention.
Figure 1B:
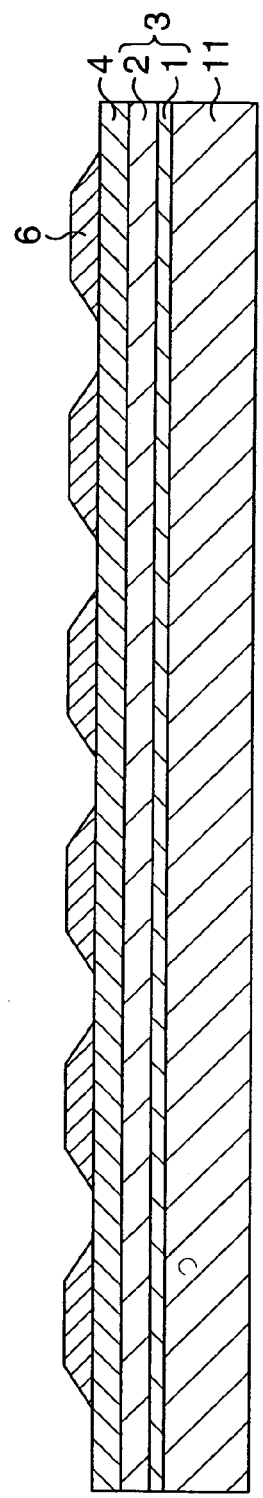

A silicon wafer of 6-inch diameter (not illustrated) was prepared. As shown in FIG. 1A, first $SiO_2$ film 11 is deposited on the silicon wafer to a film thickness of around 1000 nm by a CVD method, followed by polishing surface of the $SiO_2$ film 11 with a chemical mechanical polishing (CMP) method to planarize the surface.

Subsequently, the silicon wafer is performed with annealing treatment in nitrogen ($N_2$) atmosphere at 650° C. for 30 minutes to conduct degasification, followed by depositing Ti film 1 having a thickness of around 20 nm and Pt film 2 having a thickness of around 175 nm sequentially with a sputtering method, to form a lower electrode layer 3 consisting of laminated structure of Ti film 1 and Pt film 2.

Subsequently, with an RF sputtering method, a ferro-electric film 4 made from PZT consisting of $Pb(Zr_{1-x}Ti_x)O_3$(PZT: $0 \leq x \leq 1$), which is a ferro-electric substance, as a raw material is deposited to a thickness of around 200 nm on the lower electrode layer 3. Then, the ferro-electric film 4 is performed with rapid thermal anneal treatment (RTA treatment) to crystallize the ferro-electric film 4.

Subsequently, with a reactive sputtering method, an upper electrode layer 5 made from $IrO_2$, which is an electroconductive oxide, as a raw material is deposited to a film thickness of around 2.00 nm on the ferro-electric film 4. Then, the upper electrode layer 5 is processed into plural electrode figures with lithography and subsequent dry etching to form patterns of the plural upper electrodes 6. Thus, the state in which $SiO_2$ film 11, the lower electrode layer 3, the ferro-electric film 4 and the plural upper electrodes 6 are formed on a silicon wafer is determined to the fundamental sample, and the plural samples are prepared. Here, two kinds of silicon wafers were prepared as the samples, that is, sample A in which ratio of surface area occupied by the plural upper electrodes 6 to surface area of the semiconductor chip in the silicon wafer was 20%, and sample B in which the ratio was 0.03%.

Figure 2:
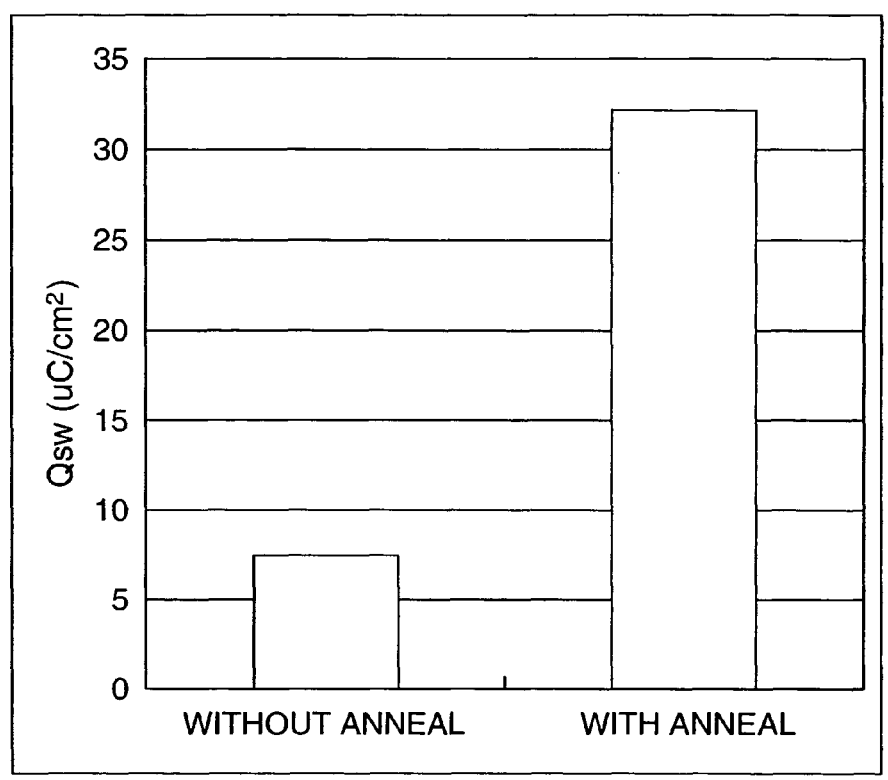
FIG. 2 is a characteristic drawing showing capacitor characteristics.

First, the sample is performed with annealing treatment for the purpose of restoring damages added to the ferro-electric film 4 at forming and processing the upper electrode layer 5. Here, it is determined that the annealing treatment is conducted at a treatment temperature of 650° C., in an oxygen ($O_2$) atmosphere for 60 minutes. The annealing treatment is performed to the plural samples simultaneously by using a horizontal furnace. Here, a result of comparing capacitor characteristics (Qsw ($\mu C/cm^2$)) in samples having been subjected to the annealing treatment and to no treatment is shown in FIG. 2. From the drawing, it is understood that, when the annealing treatment is not performed, capacitor characteristics show significant degradation. In this connection, as for the result, little difference is seen between the samples A and B. From the result, it is understood that the annealing treatment for the purpose of restoring damages of the ferro-electric film 4 after forming the pattern of the upper electrode 6 is an indispensable step.

Figure 3A:
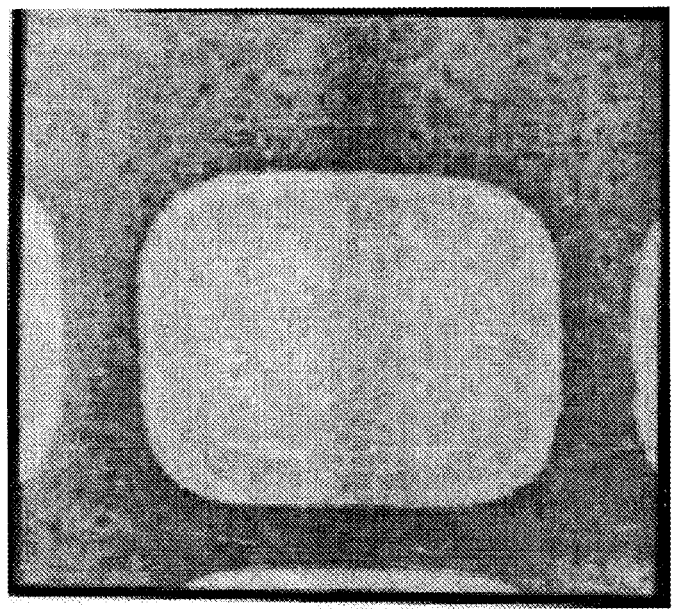
FIGS. 3A and 3B are scanning electron micrographs of respective surface states at the upper electrode.
Figure 3B:
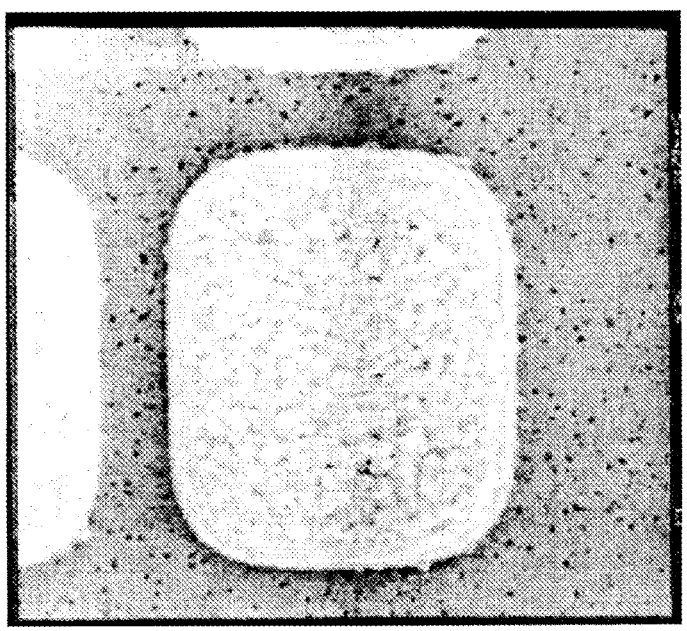
Figure 4A:
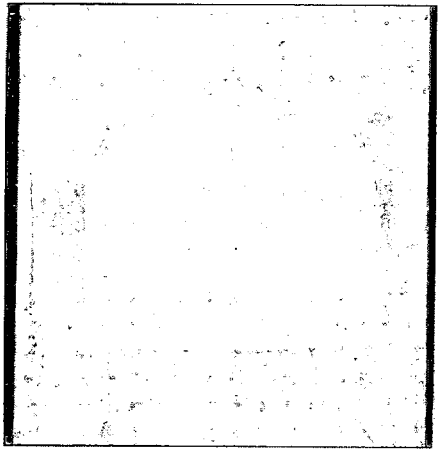
FIGS. 4A to 4D are scanning electron micrographs of respective surface states at the upper electrode.
Figure 4B:
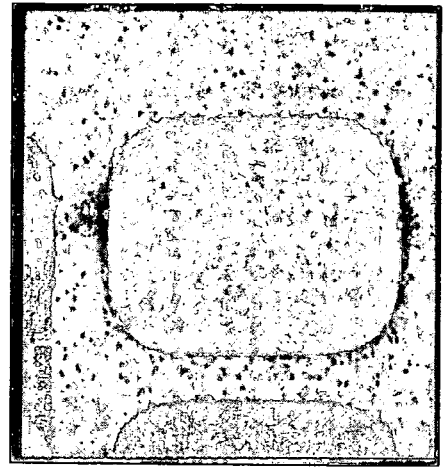
Figure 4C:
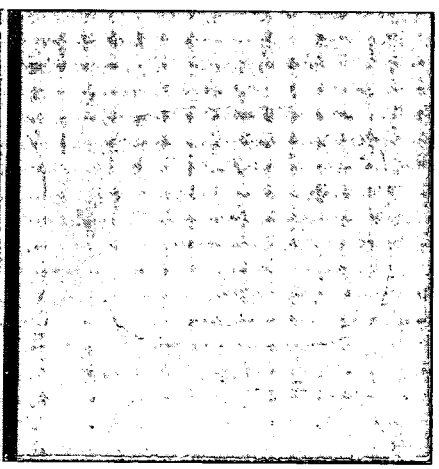
Figure 4D:
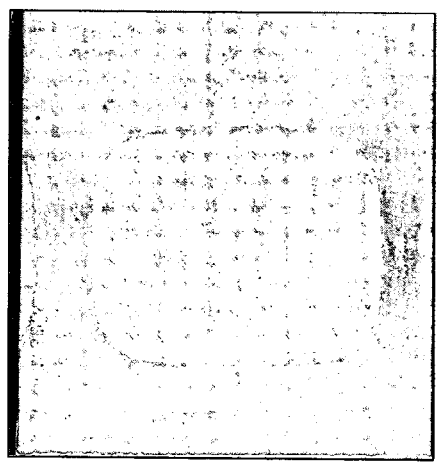

Consequently, the aforementioned annealing treatment (annealing treatment of 650° C., in an oxygen atmosphere for 60 minutes) was performed to the samples A and B, followed by photographing with a microscope to examine respective surface states of the samples A and B after the treatment. FIGS. 3A and 3B show appearances at that time. In the sample A, as shown in FIG. 3A, crystal grains of the upper electrode 6 were in a very fine state to lead to no problem. On the contrary, in the sample (B), as shown in FIG. 3B, surface roughness due to abnormal crystal growth generated in the upper electrode 6. Caused by the abnormal crystal grains, there is such concern that short circuit may occur between adjacent upper electrodes 6 to lower the process yield.

At this stage, the following was revealed. That is, in the case of one that has a large percentage of the surface area occupied by the plural upper electrodes 6 to the surface area of the semiconductor chip, as is the case for the sample A, high capacitor characteristics could be obtained only by the aforementioned annealing treatment without generating surface roughness in the upper electrode 6. On the contrary, in the case of one that has a small percentage of the surface area occupied by the plural upper electrodes 6 to the surface area of the semiconductor chip, as is the case for the sample B, surface roughness generates in the upper electrode 6 when it is subjected to the aforementioned annealing treatment alone. Accordingly, in the following consideration, the sample B in which surface roughness generates is selected as the subject thereof.

Subsequently, the sample B was used to examine whether degree of the surface roughness caused by abnormal crystal grain growth might depend on temperature of annealing treatment or not. Here, treatment temperature was determined to 350° C., 450° C., 550° C. or 650° C. FIGS. 4A to 4D show appearances of respective surface states of the upper electrode 6 photographed with a microscope. It can be understood that there is no problem in the surface state in FIG. 4A at 350° C. and FIG. 4B at 450° C., some surface roughness is observed in FIG. 4C at 550° C., and that the case of FIG. 4D at 650° C. is similar to that shown in FIG. 3B, leading to further significant surface roughness.

Figure 5:
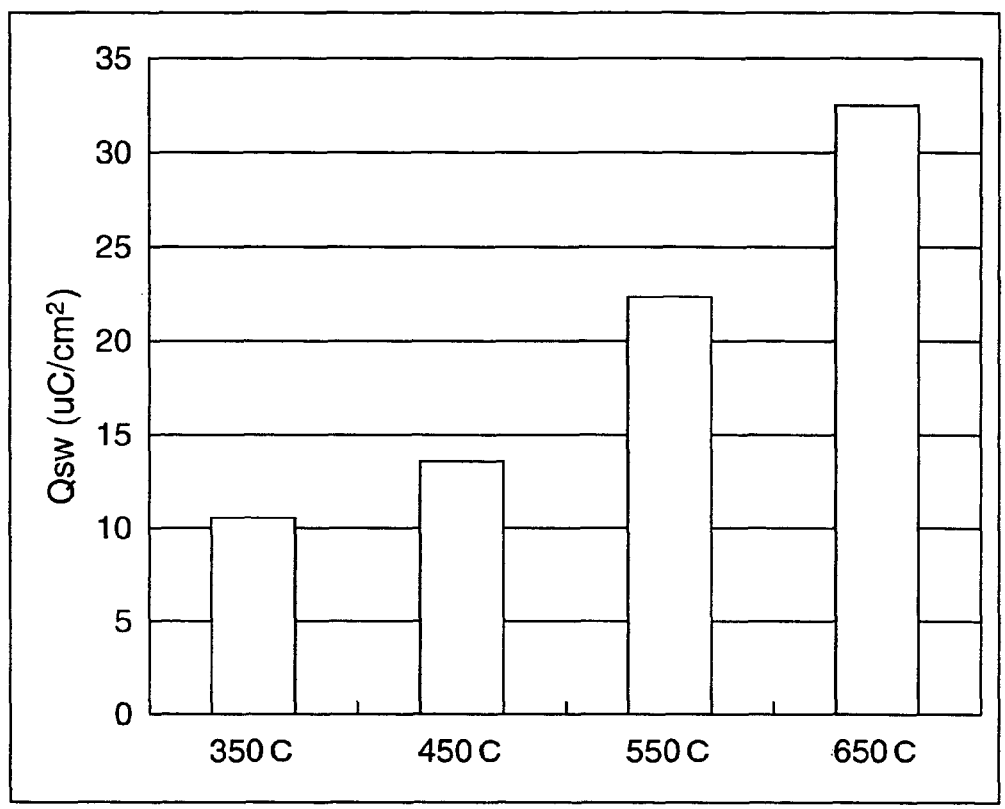
FIG. 5 is a characteristic drawing showing capacitor characteristics.

Consequently, respective samples in the state of FIGS. 4A to 4D were used to examine what effect annealing treatment temperature gave on capacitor characteristics. As shown in FIG. 5, it is understood that a low annealing treatment temperature can not sufficiently restore capacitor characteristics. In other words, it was revealed that a high treatment temperature around 650° C. is necessary to obtain high capacitor characteristics, and that it is impossible to allow suppression of surface roughness in the upper electrode 6 and enhancement of capacitor characteristics to be compatible only by adjusting temperature of the annealing treatment.

Subsequently, by using the sample B, such rapid annealing treatment (RTA treatment) as treatment temperature of 650° C., in an oxygen atmosphere for 1 minute was conducted in order to examine effects according to annealing methods. The annealing treatment described above was conducted by using a horizontal furnace capable of setting plural wafers, for example 25 wafers, in one quartz basket, and by setting 4 quarts baskets in the reactor core tube. On the contrary, RTA was conducted by using a single-wafer furnace in which a wafer is inserted in a quartz chamber per one.

Figure 6A:
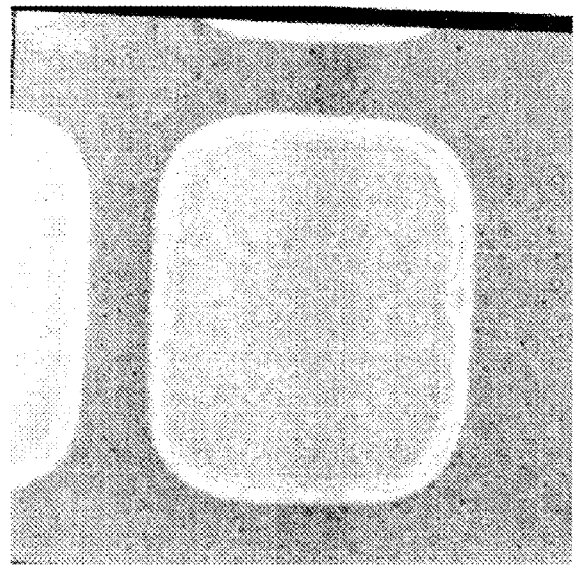
FIGS. 6A and 6B are scanning electron micrographs of respective surface states at the upper electrode.
Figure 6B:
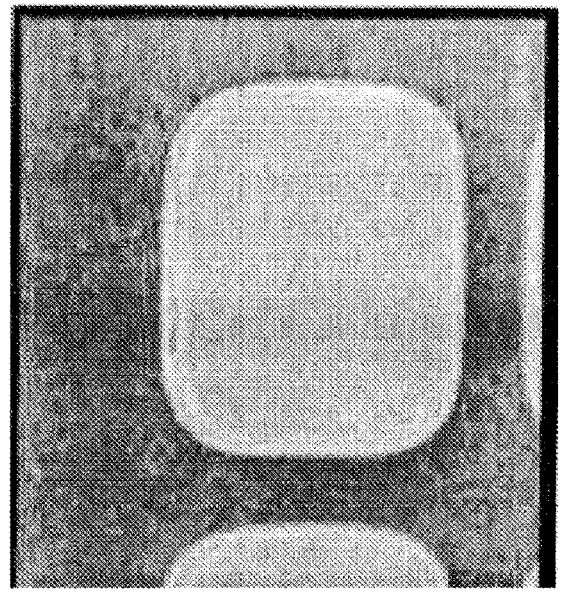

FIGS. 6A and 6B show appearances of surface states of the upper electrodes 6 before and after the RTA treatment photographed with a microscope. There is seen no difference in surface states between the surface state of the upper electrode 6 before the RTA treatment in FIG. 6A and the surface state of the upper electrode 6 after the RTA treatment in FIG. 6B. It can be understood that practice of the RTA treatment leads to no generation of surface defect.

Figure 7:
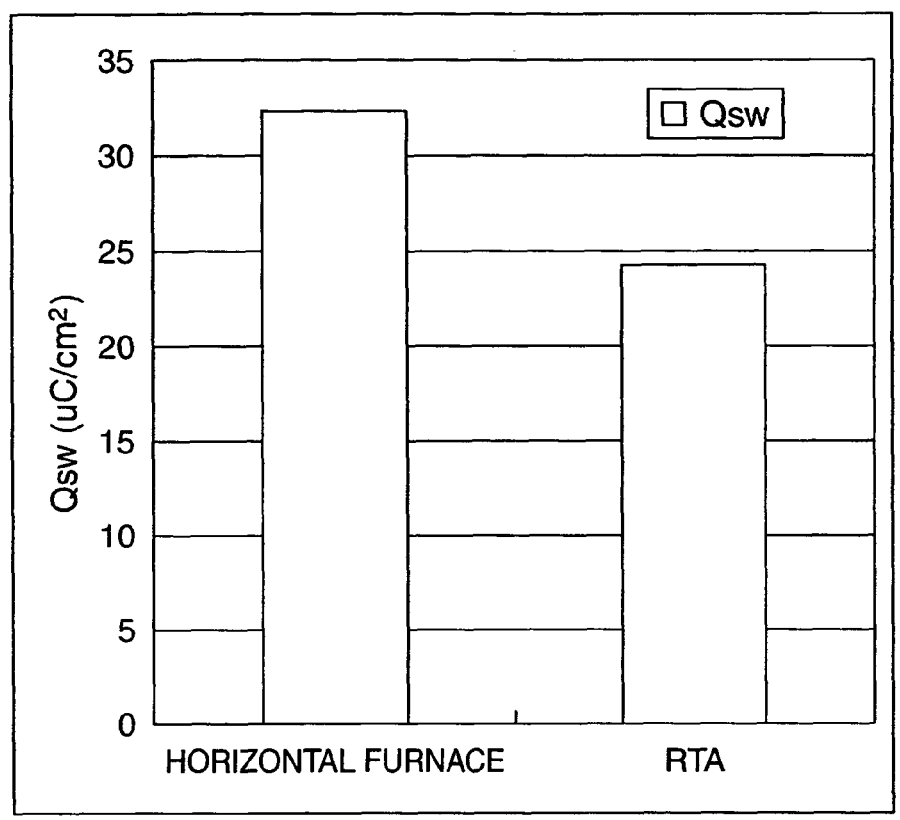
FIG. 7 is a characteristic drawing showing capacitor characteristics.

Subsequently, capacitor characteristics were examined for samples in respective states of FIGS. 6A and B. As shown in FIG. 7, the case where the RTA treatment was performed as shown in FIG. 6A represents higher Qsw than the case without the annealing treatment shown in FIG. 2, however it represents lower Qsw than the case where the annealing treatment was conducted with a horizontal furnace as shown in FIG. 6B.

Figure 8A:
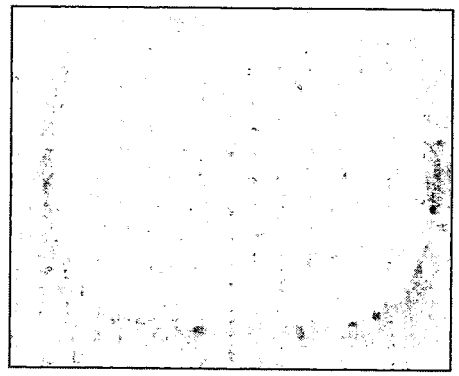
FIGS. 8A to 8C are scanning electron micrographs of respective surface states at the upper electrode.
Figure 8B:
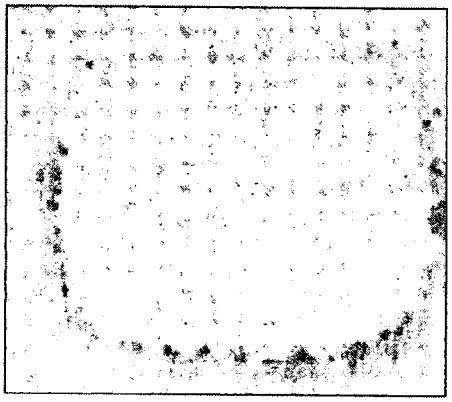
Figure 8C:
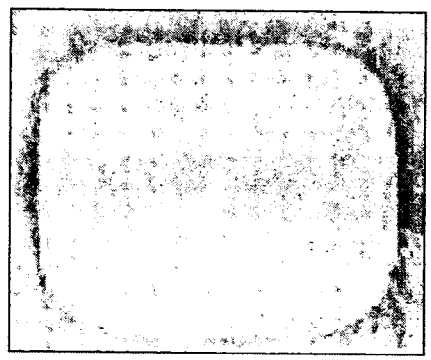

Consequently, subsequent to the RTA treatment, annealing treatment was conducted in a horizontal furnace for the purpose of restoring capacitor characteristics. Here, the sample B was used for RTA treatment of two conditions, that is, at treatment temperature of 650° C. or 700° C., of oxygen flow volume of 2 L/min (2 SLM) for 1 minute, followed by annealing treatment under the conditions of an oxygen atmosphere for 60 minutes with a horizontal furnace. FIGS. 8A to 8C show appearances for surface state of the upper electrode 6 photographed with a microscope. FIG. 8A is a picture of a sample without the RTA treatment for comparison, FIG. 8B is a pictures of the sample subjected to the RTA treatment at 650° C., and FIG. 8C is a picture of a sample subjected to the RTA treatment at 700° C., photographed with a scanning electron microscope (SEM). It is understood by comparing FIG. 8A with FIG. 8B and FIG. 8C that surface roughness of the upper electrode 6 is significantly reduced by the heat treatment of two steps employing the RTA treatment and the annealing treatment with a horizontal furnace. Further, by comparing FIG. 8B and FIG. 8C, it is understood that the case where the RTA treatment was conducted at a treatment temperature of 700° C. gives a smoother surface state compared with the case where the RTA treatment was conducted at a treatment temperature of 650° C.

Figure 9:
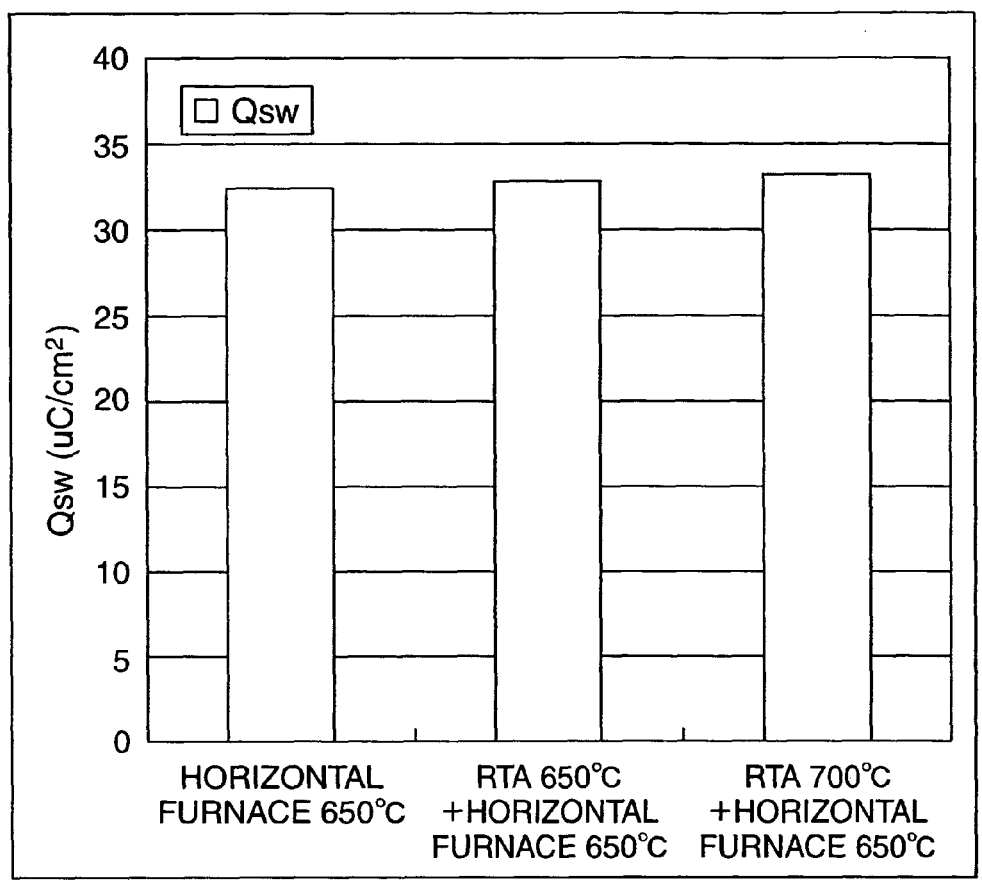
FIG. 9 is a characteristic drawing showing capacitor characteristics.

Subsequently, capacitor characteristics were examined for samples of respective states shown in FIGS. 8A to 8C. As shown in FIG. 9, both cases as shown in FIG. 8A, where only the annealing treatment with a horizontal furnace was conducted without the RTA treatment, and in FIGS. 8B and 8C, where the RTA treatment was conducted prior to the annealing treatment with a horizontal furnace, represent approximately equal Qsws, irrespective of temperatures of the RTA treatment. Accordingly, it is understood that the RTA treatment gives no adverse effect on capacitor characteristics.

From the result described above, practice of the annealing treatment of two steps in the state where the upper electrode of the ferro-electric capacitor configuration has been patterned, in other words, practice of an RTA treatment with a single-wafer furnace firstly as a first annealing treatment followed by an annealing treatment with a horizontal furnace as a second annealing treatment makes it compatible to suppress surface roughness and to acquire good capacitor characteristics.

(Optimum Conditions of the Invention)

Hereinafter, optimum conditions will be considered for the annealing treatment of two steps according to the invention.

First, upon searching the conditions, reason for generation of surface roughness on the upper electrode is considered. In order to search the reason, two kinds of samples are prepared similar to the above, that is, the sample A in which percentage of surface area occupied by plural upper electrodes 6 to surface area of a semiconductor chip on a silicon wafer is 20%, and the sample B in which the percentage is 0.03%. As described above, in the sample A, no surface roughness generates only with the ordinary one annealing treatment. On the contrary, in the sample B, surface roughness generates when it is subjected to the ordinary one annealing treatment alone.

With X-ray photoelectron spectroscopy (XPS), surface composition was analyzed for respective upper electrodes in samples A and B. The results are shown in FIGS. 10A to 11B. Here, FIGS. 10A and 10B illustrate the case where no annealing treatment is performed, and FIGS. 11A and 11B illustrate the case where only the annealing treatment was performed. In both drawings, FIGS. 10A and 11A show a case where the sample A is used, and FIGS. 10B and 11B show a case where the sample B is used, respectively.

Here, attention is focused on percentage (atom %) of lead (Pb), which is a volatile element, among surface-composing elements.

As shown in FIGS. 10A and 10B, in the case where no annealing treatment is practiced, Pb of similar levels are observed irrespective of small or large of the surface area-occupying ratio, but the level is small. On the contrary, as shown in FIGS. 11A and 11B, it is understood that, in the case where the annealing treatment is practiced, increase of lead is observed in samples of either surface area-occupying ratio, and that the sample with the surface area-occupying ratio of 0.03% has a larger Pb ratio than the sample with that of 20%. This is thought that Pb of a low vapor pressure was evaporated at the annealing from the ferro-electric film (consisting of PZT) exposed at surface due to processing of the upper electrode, and that it adhered on the surface of the upper electrode. The fact that the surface-occupying ratio of the upper electrode is 20% means that the ferro-electric film is exposed by 80% at semiconductor chip surface after processing of the upper electrode, and the that the surface-occupying ratio of the upper electrode is 0.03% means that the ferro-electric film is exposed by 99.97% at semiconductor chip surface after processing of the upper electrode. Volatilization of Pb is considered to generate from exposing ferro-electric film, and difference between exposing areas may bring about difference in Pb amount adhered to the upper electrode surface. It is rational to consider that the excess Pb reacts with $IrO_x$ as the upper electrode material to generate surface roughness on the upper electrode.

Based on the above consideration, a mechanism is considered for explaining why surface roughness does not generate on the upper electrode according to the annealing treatment of two steps according to the invention.

Since the RTA treatment is conducted at a high temperature higher than that of the subsequent annealing treatment at a horizontal furnace, similar to the above, volatilization of Pb occurs from the ferro-electric film. However, in this case, the RTA treatment is conducted in a single-wafer furnace, therefore oxygen as the atmosphere continually flows near the wafer surface to discharge volatilizing Pb, if it generates. That is, by conducting first the high-temperature RTA treatment, Pb volatilizes by an amount consisting with the treatment temperature and the like. Since volatilizing Pb is discharged as described above, in a heat treatment conducted at a temperature lower than that of the RTA treatment (of course conditions such as treatment time can not be ignored), little volatilization of Pb occurs. Accordingly, it is considered that, when an annealing treatment for restoring capacitor characteristics subsequent to the RTA treatment is conducted by using a horizontal furnace, little Pb volatilizes because treatment temperature of the annealing treatment is not higher than that of the RTA treatment, to suppress generation of surface roughness of the upper electrode.

It is considered from the consideration described above that the most important factors of the RTA treatment for suppressing generation of surface roughness of the upper electrode are flow volume of oxygen as an atmosphere in an apparatus which exerts function of removing volatilizing Pb, and treatment temperature in order to volatilize a sufficient quantity of Pb at the RTA treatment.

(1) About an Adequate Range of the Oxygen Flow Volume

Figure 12A:
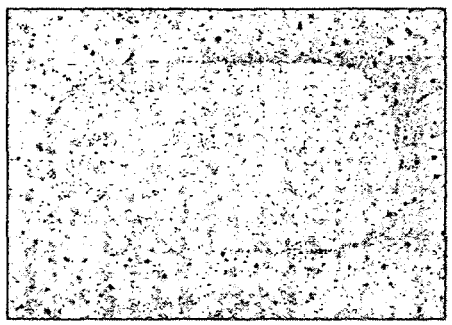
FIGS. 12A and 12B are scanning electron micrographs of respective surface states at the upper electrode.
Figure 12B:
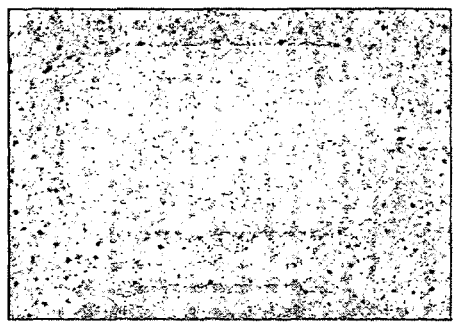

By using the sample B, RTA treatments were conducted under respective two conditions, that is, at a treatment temperature of 700° C., at an oxygen flow volume of 2 L/min or 10 L/min, and for 1 minute. FIGS. 12A and 12B show appearances of surface state of the upper electrode 6 at this time photographed with a microscope. Here, FIG. 12A shows appearance of the case where the oxygen flow volume was determined to 2 L/min, and FIG. 12B shows appearance of the case where the oxygen flow volume was determined to 10 L/min, respectively. As shown in the drawings, it was confirmed that a larger oxygen flow volume gives a smoother surface state of the upper electrode 6.

Based on the above result, in the invention, the oxygen flow volume of the above RTA treatment is determined to a predefined value in the range from 0.1 L/min to 100 L/min. Here, it is considered that a flow volume lower than 0.1 L/min may not perform sufficiently function of removing Pb volatilized from the ferro-electric film 4, and 100 L/min is the limit value in current apparatus configuration.

(2) About an Adequate Range of Treatment Temperature

Figure 13A:
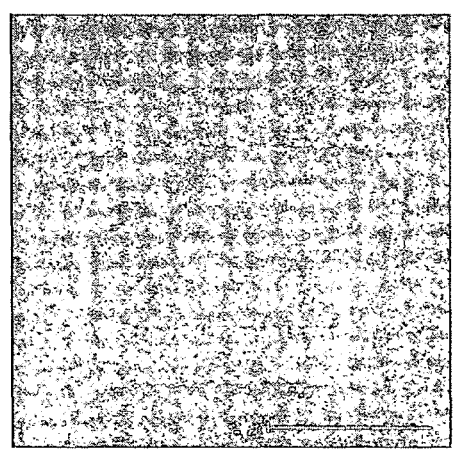
FIGS. 13A and 13B are scanning electron micrographs of respective surface states at the upper electrode.
Figure 13B:
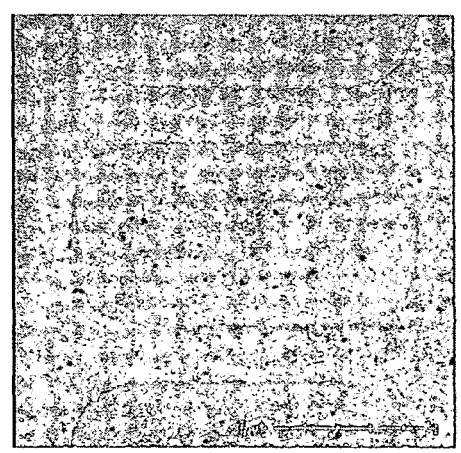

By using the sample B, RTA treatments were conducted under respective two conditions, that is, at a treatment temperature of 700° C. or 750° C., at an oxygen flow volume of 8 L/min, and for 1 minute. FIGS. 13A and 13B show appearances of surface state of the upper electrode 6 at this time photographed with a microscope. Here, FIG. 13A shows appearance of the case where the treatment temperature was determined to 700° C., and FIG. 13B shows appearance of the case where the treatment temperature was determined to 750° C., respectively. As shown in the drawings, at 700° C., surface state of the upper electrode 6 is smooth and clear, but at 750° C., formation of some amount of void-like minute holes has started in the upper electrode 6. Although such level of surface state is not a cause for any problem, it is considered that level of hole formation will increase along with further increase of temperature.

Based on the above result, in the invention, the treatment temperature of the above RTA treatment is determined to a predefined value in the range from 400° C. to 1000° C. Here, a temperature lower than 400° C. can not volatilize Pb sufficiently from the ferro-electric film 4, and a temperature higher than 1000° C. results in significant generation of holes, not to lead to attainment of the expected surface state.

From the above results, it is possible to obtain good capacitor characteristics, while sufficiently suppressing surface roughness, by conducting the annealing treatment of two steps, that is, by conducting firstly an RTA treatment with a single-wafer furnace as a first annealing treatment under such condition in which especially treatment temperature and oxygen flow volume are defined as described above, followed by an annealing treatment with a horizontal furnace as a second annealing treatment, in the state where upper electrodes of the ferro-electric capacitor configuration have been patterned.

When the annealing treatment of two steps are practiced under the condition where the oxygen flow volume and treatment temperature are within the aforementioned adequate range, crystal diameters of $IrO_2$ constituting the upper electrode without surface roughness become 50 nm or less. This means that when crystal diameters of material of an upper electrode (here, $IrO_2$) are 50 nm or less, the upper electrode is one without surface roughness.

(Especially Effective Application Range in which Superiority of the Invention is Exerted)

According to the aforementioned consideration, it is considered that exposure level of the ferro-electric film upon patterning the upper electrode becomes an index for exertion of superiority of the invention and the present invention exerts a large effect when the exposure level is higher than a predefined value, and that, when the exposure level is smaller than the predefined value, only an annealing treatment for restoring capacitor characteristics is sufficient and surface roughness does not generate in the upper electrode even if an RTA treatment prior to the annealing treatment is not conducted.

However, the exposure level of the ferro-electric film can not easily be known, and can not be said to be a definite standard for representing the effective application range of the invention. Accordingly, in order to grasp quantitatively such effective application range of the invention by an easily known and definite standard, we considered as follows.

Firstly, we focus attention on size of a wafer to be used. In the above examples, 6-inch diameter silicon wafers were used in both samples A and B. But here, a 8-inch diameter silicon wafer is used, in which the upper electrode of the ferro-electric capacitor configuration is patterned so that the occupation ratio of the surface area thereof to the surface area of the semiconductor chip becomes 12%. A chip of the state is defined as a sample C.

Then, by using the sample C, an annealing treatment was practiced at a treatment temperature of 650° C., in an oxygen atmosphere for 60 minutes with a horizontal furnace, in order to restore capacitor characteristics. As the result, surface roughness generated as is the case for the sample B, whose surface occupation ratio of the upper electrode is 0.03%, as shown in FIG. 3B. Accordingly, when the annealing treatment of two steps of the invention, that is, the RTA treatment at 650° C. for 1 minute in an oxygen atmosphere followed by an annealing treatment with a horizontal furnace, was practiced, surface roughness was not observed and capacitor characteristics (Qsw) also represented a high value.

The reason why thus surface roughness generates in the upper electrode in an 8-inch diameter wafer having a larger surface area occupation ratio of the upper electrode than the case for a 6-inch diameter wafer when only an annealing treatment for restoring capacitor characteristics is conducted, is considered as follows, that is, area of the ferro-electric film exposing on the surface after processing the upper electrode is larger in a 8-inch diameter wafer than in a 6-inch diameter wafer and, accordingly, exposure level of the ferro-electric film is larger in a 8-inch diameter wafer than in a 6-inch diameter wafer when the surface area occupation ratios of the upper electrode is identical.

According to the aforementioned consideration, it is rational to consider that, when the upper limit of the surface area occupation ratio of the upper electrode is determined based on a wafer having a smallest size that has, so to say, a narrowest application range of the invention, the upper limit value may be applied to generally all the sizes of wafers. Since a wafer of the smallest size to which a ferro-electric memory is applicable is a 6-inch diameter wafer, the upper limit of the surface area occupation ratio of the upper electrode is sufficiently defined by using a 6-inch diameter wafer. Thus, an examination was made of at what occupation ratio surface roughness generates while changing surface area occupation ratios of the upper electrode to reveal that 6% is a border, and that a ratio smaller than the value causes generation of surface roughness.

In the invention, a ferro-electric memory, in which a surface area occupation ratio of the upper electrode to area of a semiconductor chip is 6% or less, is determined as an effective application range thereof.

Specific Embodiments to which the Invention is Applied

Hereinafter, configuration of a ferro-electric memory, along with a fabricating method, will be explained as specific embodiments to which the invention is applied.

FIGS. 14A to 16E are schematic cross-sectional views illustrating a fabricating method of a ferro-electric memory of the embodiment in the order corresponding to steps.

Figure 14A:
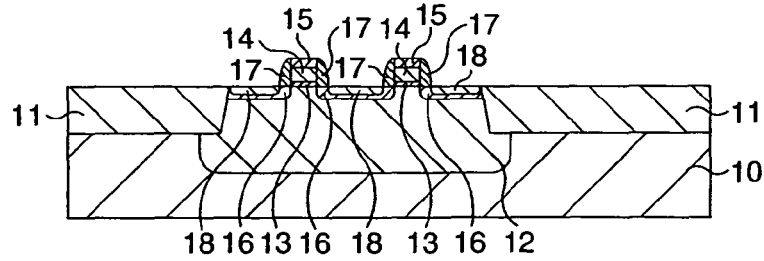
FIGS. 14A to 14E are schematic cross-sectional views showing the fabrication method of the ferro-electric memory of the embodiment in the order corresponding to steps.

First, as shown in FIG. 14A, a MOS transistor 20 that functions as a selective transistor is formed on a silicon semiconductor substrate 10. Specifically, an element isolation structure 11 is formed on a surface layer of the silicon semiconductor substrate 10 by, for example, an STI (Shallow Trench Isolation) method to establish an element active region.

Next, into the element active region, an impurity, here $B^+$ is ion-implanted under the condition of a dose amount of $1.0 \times 10^{13}/cm^2$ and an acceleration energy of 300 keV, for example, to form a well 12.

Next, by forming a thin gate insulating film 13 having a film thickness of around 3 nm on the element active region with thermal oxidation or the like followed by depositing a polycrystalline silicon layer having a film thickness of around 180 nm and, for example, a silicon nitride film having a film thickness of around 30 nm on the gate insulating film 13 with a CVD method, and by processing the silicon nitride film, the polycrystalline silicon layer and the gate insulating film 13 into an electrode shape with lithography and subsequent dry etching, a gate electrode 14 is patterned on the gate insulating film 13. At this time, simultaneously, a cap film 15 consisting of a silicon nitride film is patterned on the gate electrode 14.

Next, while utilizing the cap film 15 as a mask, an impurity, here $As^+$ is ion-implanted into the element active region under the condition, for example, of doping amount of $5.0 \times 10^{14}/cm^2$ and acceleration energy of 10 keV to form a so-called LDD region 16.

Next, for example, a silicon oxide film is deposited on the whole surface with a CVD method, followed by so-called etch backing the silicon oxide film to form a sidewall insulating film 17 while remaining the silicon oxide film on side surfaces of the gate electrode 14 and the cap film 15.

Next, while utilizing the cap film 15 and the sidewall insulating film 17 as a mask, an impurity, here $P^+$ is ion-implanted into the element active region under a condition that gives a higher impurity concentration than that in the LDD region 16, for example, the condition of dose amount of $1.0 \times 10^{15}/cm^2$ and acceleration energy of 15 keV, to form a source/drain region 18 that is overlapped with the LDD region 16, thereby completing a MOS transistor 20.

Figure 14B:
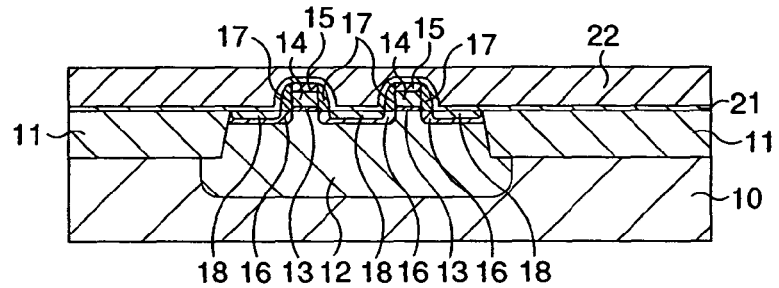

Subsequently, as shown in FIG. 14B, a protective film 21 of the MOS transistor 10 and a first interlayer dielectric film 22 are formed.

Specifically, the protective film 21 and the first interlayer dielectric film 22 are sequentially deposited so as to cover the MOS transistor 20. Here, as for the protective film, for example, a silicon nitride film as a raw material is deposited to a film thickness of around 70 nm with a CVD method. As for the first interlayer dielectric film 22, a laminated structure is formed by film-forming sequentially, for example, a plasma SiO film (film thickness of around 20 nm), plasma SiN film (film thickness of around 80 nm) and plasma TEOS film (film thickness of around 1000 nm) and, after the lamination, it is polished with CMP until the film thickness becomes around 700 nm.

Figure 14C:
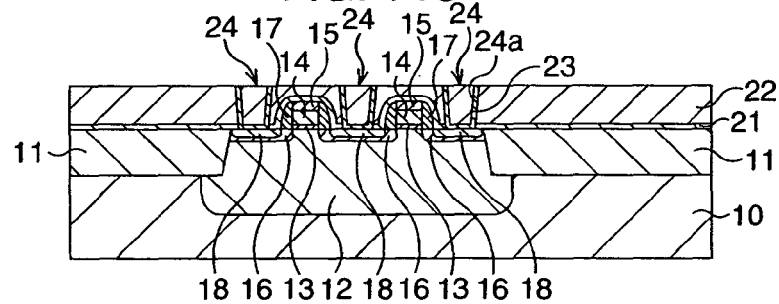

Subsequently, as shown in FIG. 14C, a plug 24 that is connected with the source/drain region 18 is formed.

Specifically, the interlayer dielectric film 22 and the protective film 21 are processed with lithography and subsequent dry etching until a part of the surface of the source/drain region 18 is exposed to form a via hole 24a, for example, having a diameter of about 0.25 μm. Next, for example, a Ti film (film thickness of around 30 nm) and TiN film (film thickness of around 20 nm) are deposited with a sputtering method so as to cover the wall surface of the via hole 24a to form a ground film (glue film) 23, followed by forming, for example, a tungsten (W) film with a CVD method so as to mount the via hole 24a via the glue film 23. Then, the W film and the glue film 23 are polished with CMP while utilizing the first interlayer dielectric film 22 as a stopper, and a first plug 24 is formed in which inside of the via hole 24a is mounted with W via the glue film 23.

Figure 14D:
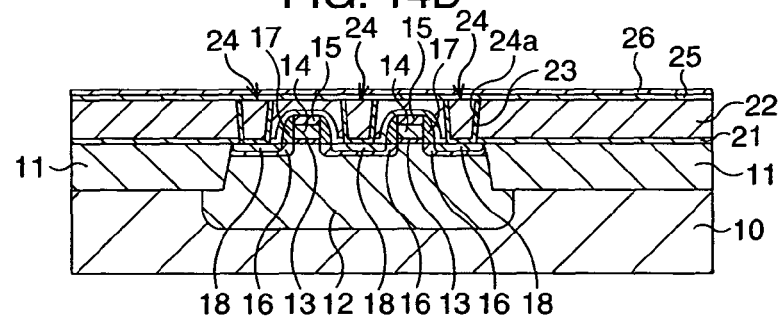

Subsequently, as shown in FIG. 14D, an antioxidant film 25 for the first plug 24 and an orientation-enhancing film 26 for the lower electrode are formed.

Specifically, the antioxidant film 25 is formed in order to prevent oxidation of the first plug 24 by thermal annealing in an oxygen atmosphere upon forming the ferro-electric capacitor configuration. As for the antioxidant film 25, for example, a laminated structure of SiON (film thickness of around 130 nm) and plasma TEOS (film thickness of around 130 nm) are formed. As for the orientation-enhancing film 26, for example, it is a silicon oxide film.

Figure 14E:
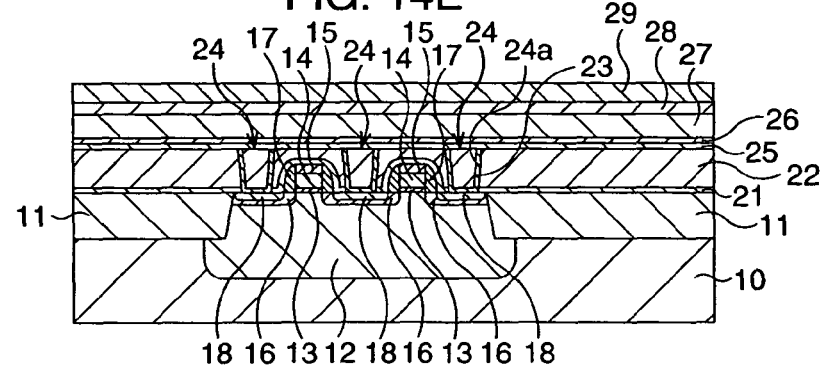

Subsequently, as shown in FIG. 14E, a lower electrode layer 27, a ferro-electric film 28 and an upper electrode layer 29 are formed sequentially.

Specifically, first, a Ti film having a film thickness of around 20 nm and a Pt film having a film thickness of around 150 nm, for example, are deposited sequentially with a sputtering method, followed by forming the lower electrode layer 27 to the laminated structure of the Ti film and Pt film. Next, a ferro-electric film 28 consisting of, for example, PZT being a ferro-electric substance is deposited with an RF sputtering method on the lower electrode layer 27 to a film thickness of around 200 nm. Then, the RTA treatment is performed to the ferro-electric film 28 to crystallize the ferro-electric film 28. Next, the upper electrode layer 29 made of, for example, $IrO_2$ which is an electroconductive oxide as a raw material is deposited on the ferro-electric film 28 to a film thickness of around 200 nm with a reactive sputtering method. In this connection, Ir, Ru, $RuO_2$, $SrRuO_3$ or other electroconductive oxides as a raw material of the upper electrode layer 29 in place of $IrO_2$, or a laminated structure thereof may be used.

Figure 15A:
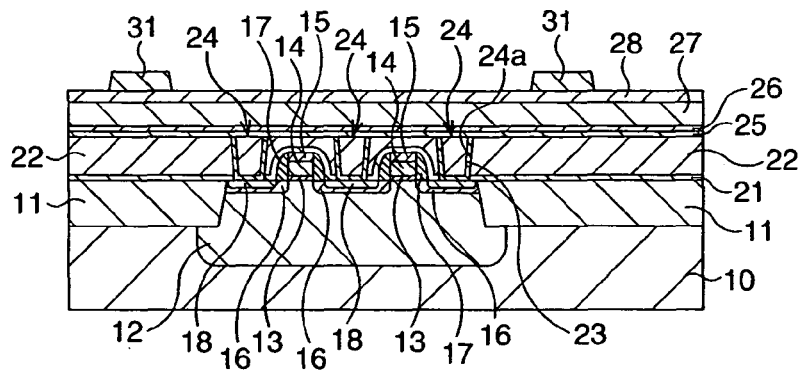
FIGS. 15A to 15D are schematic cross-sectional views showing the fabrication method of the ferro-electric memory of the embodiment in the order corresponding to steps following the FIG. 14E.

Subsequently, as shown in FIG. 15A, after an upper electrode 31 is patterned, the annealing treatment of two steps, which is the characteristic of the embodiment, is performed to the substrate surface.

Specifically, first, the upper electrode layer 29 is processed into a shape of plural electrodes with lithography and subsequent dry etching to form a pattern of plural upper electrodes 31.

Figure 17A:
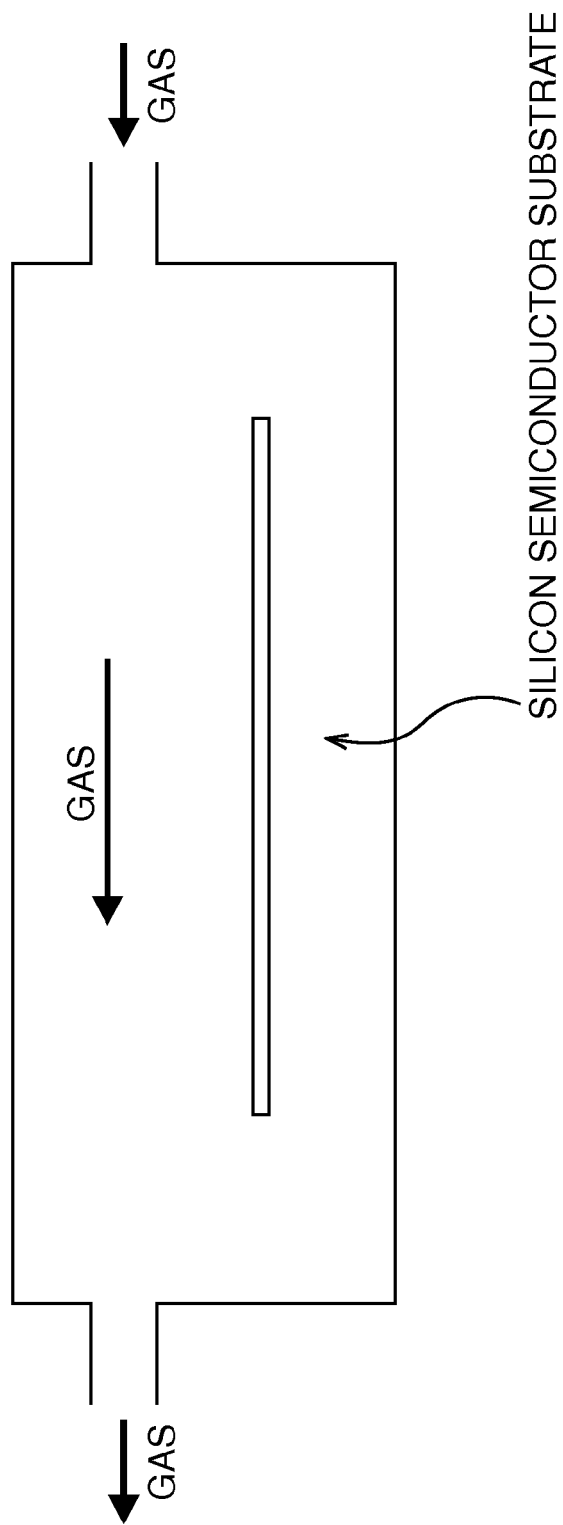
FIGS. 17A and 17B are representations of a single-wafer furnace and horizontal wafer furnace, respectively.

Next, the first annealing treatment, that is, the RTA treatment with a single-wafer furnace as illustrated in FIG. 17A for preventing surface roughness of the upper electrode 31 is performed. In the RTA treatment, by using an infrared lamp for example, the treatment temperature is determined to a value in the range from 400° C. to 1000° C., and the oxygen flow volume is determined to a value in the range form 0.1 L/min to 100 L/min. Here, the RTA treatment is practiced, for example, at a treatment temperature of 700° C., and at an oxygen flow volume of 10 L/min for 1 minute. In this connection, a predefined laser and the like, for example, may be used in place of an infrared lamp.

Figure 17B:
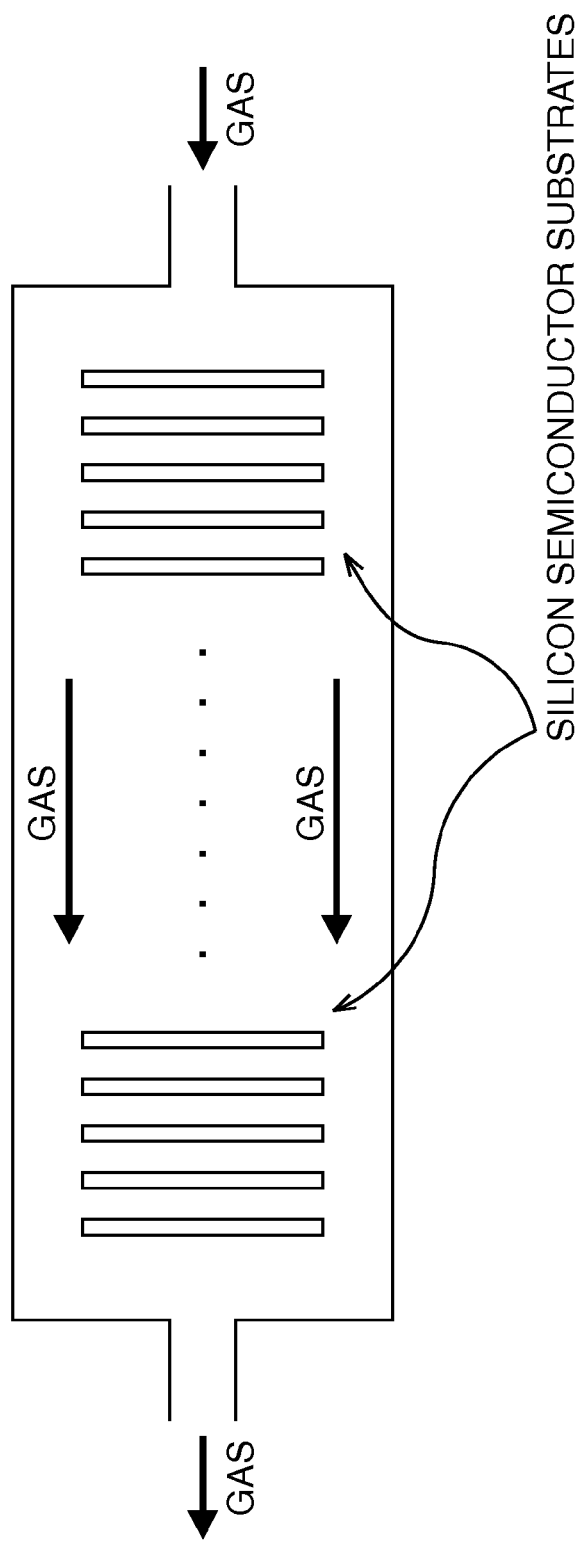

Next, the second annealing treatment for restoring capacitor characteristics, in other words, the annealing treatment with a horizontal furnace as illustrated in FIG. 17B is performed. The annealing treatment is practiced at a lower temperature than that in the RTA treatment, which is the first annealing treatment, here at a treatment temperature of 650° C., in an oxygen atmosphere for 60 minutes.

Thus, by performing the annealing treatment of two steps, it is possible to obtain sufficiently both effects of preventing surface roughness of the upper electrode 31 and restoring the capacitor characteristics.

Figure 15B:
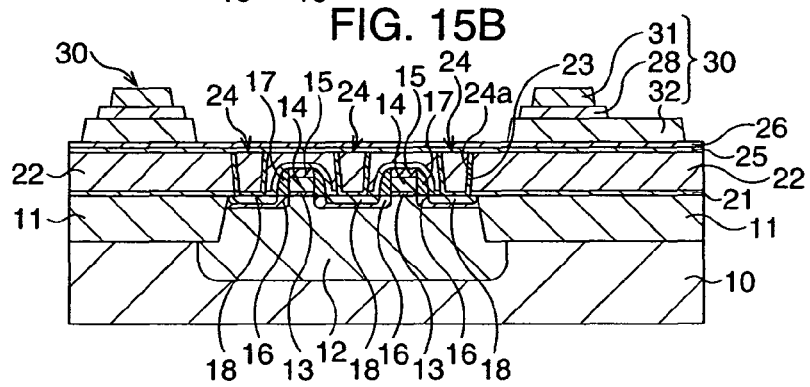

Subsequently, as shown in FIG. 15B, the ferro-electric film 28 and the lower electrode layer 27 are processed to form a ferro-electric capacitor configuration 30.

Specifically, first the ferro-electric film 28 is processed with lithography and subsequent dry etching so as to have a slightly larger size than that of the upper electrode 29, in order to match with the upper electrode 31.

Next, the lower electrode layer 27 is processed with lithography and subsequent dry etching so as to have a slightly larger size than that of the upper electrode 27, in order to match with the processed ferro-electric film 28 to pattern a lower electrode 32. Herewith, the ferro-electric film 28 and the upper electrode 31 are laminated sequentially on the lower electrode 32, to complete the ferro-electric capacitor configuration 30 in which the lower electrode 32 and the upper electrode 31 are capacitively coupled via the ferro-electric film 28.

Figure 15C:
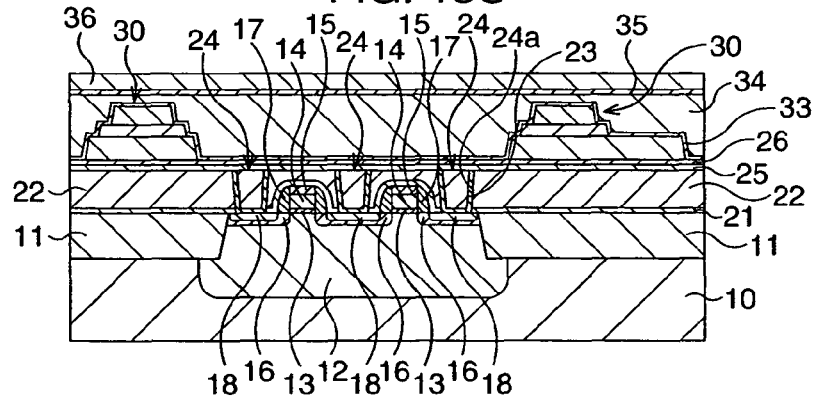

Subsequently, as shown in FIG. 15C, a first protective film 33, a second interlayer dielectric film 34, a second protective film 35 and an oxide film 36 are formed.

Specifically, the first protective film 33, the second interlayer dielectric film 34, the second protective film 35 and the oxide film 36 are formed into a laminate sequentially so as to cover the ferro-electric capacitor configuration 30. Here, the first protective film 33 is one for inhibiting damages that are given to the ferro-electric substance capacitor configuration 30 by multilayer processing after forming the ferro-electric substance capacitor configuration 30. It is formed, for example, so as to have a film thickness of around 50 nm with a sputtering method using alumina as a raw material. As for the second interlayer dielectric film 34, for example, a plasma TEOS film is deposited so as to have a film thickness of around 1400 nm, followed by polishing with CMP until the film thickness becomes around 1000 nm. After the CMP, for example, a plasma annealing treatment with $N_2O$ is performed for the purpose of dehydrating the second interlayer dielectric film 34. The second protective film 35 is one for suppressing damages that are given to the ferro-electric substance capacitor configuration 30 by the following multilayer processing. It is formed, for example, so as to have a film thickness of around 50 nm with a sputtering method using alumina as a raw material. As for the oxide film 36, for example, a plasma TEOS film is deposited so as to have a film thickness of around 300 nm.

Figure 15D:
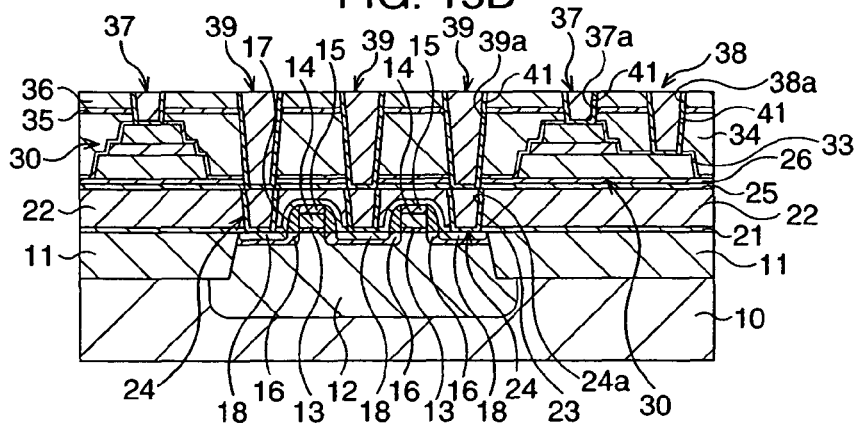

Subsequently, as shown in FIG. 15D, a second plug 39 that is connected with plugs 37, 38 and the first plug 24 of the ferro-electric capacitor configuration 30 is formed.

First, via holes 37a and 38a to the ferro-electric capacitor configuration 30 are formed.

Specifically, as lithography and subsequent dry etching, by practicing simultaneously both of processing performed to the oxide film 36, the second protective film 35, the second interlayer dielectric film 34 and the first protective film 33 until a part of the surface of the upper electrode 31 is exposed, and processing performed to the oxide film 36, the second protective film 35, the second interlayer dielectric film 34 and the first protective film 33 until a part of the surface of the lower electrode 32 is exposed, the via holes 37a and 38a, for example, having a diameter of about 0.50 μm are formed simultaneously at respective sites. At forming these via holes 37a and 38a, the respective upper electrode 31 and lower electrode 32 act as an etching stopper.

Next, an annealing treatment is practiced in order to restore damages given to the ferro-electric capacitor configuration 30 by various steps after formation of the ferro-electric capacitor configuration 30. Here, annealing treatment is practiced at a treatment temperature of 500° C., in an oxygen atmosphere for 60 minutes.

Next, a via hole 39a to the first plug 24 is formed.

Specifically, by using the first plug 24 as an etching stopper, the oxide film 36, the second protective film 35, the second interlayer dielectric film 34, the first protective film 33, the orientation-enhancing film 26 and the antioxidant film 25 are processed with lithography and subsequent dry etching until a part of the surface of the first plug 24 is exposed, to form the via hole 39a, for example, having a diameter of about 0.22 μm.

Next, plugs 37, 38 and a second plug 39 are formed.

First, an RF pre-treatment, which corresponds to several 10 nm, here around 10 nm in terms of normal etching of an oxide film, is conducted followed by depositing, for example, TiN film to a film thickness of around 75 nm so as to cover respective wall surfaces of the via holes 37a, 38a and 39a with a sputtering method, to form a ground film (glue film) 41. Then, for example, W film is formed so as to mount the via holes 37a, 38a and 39a via glue film 41 with a CVD method. After that time, the W film and glue film 41 are polished with CMP while utilizing the oxide film 36 as a stopper, and the plugs 37, 38 and the second plug 39 are formed in which inside of the via holes 37a, 38a and 39a are mounted with W via the glue film 41. Here, the first and second plugs 24 and 39 are made to a so-called via-to-via configuration constituted by connecting both plugs electrically. Due to the via-to-via configuration, an etching margin for forming a via hole is widened to modify an aspect ratio of a via hole.

Figure 16A:
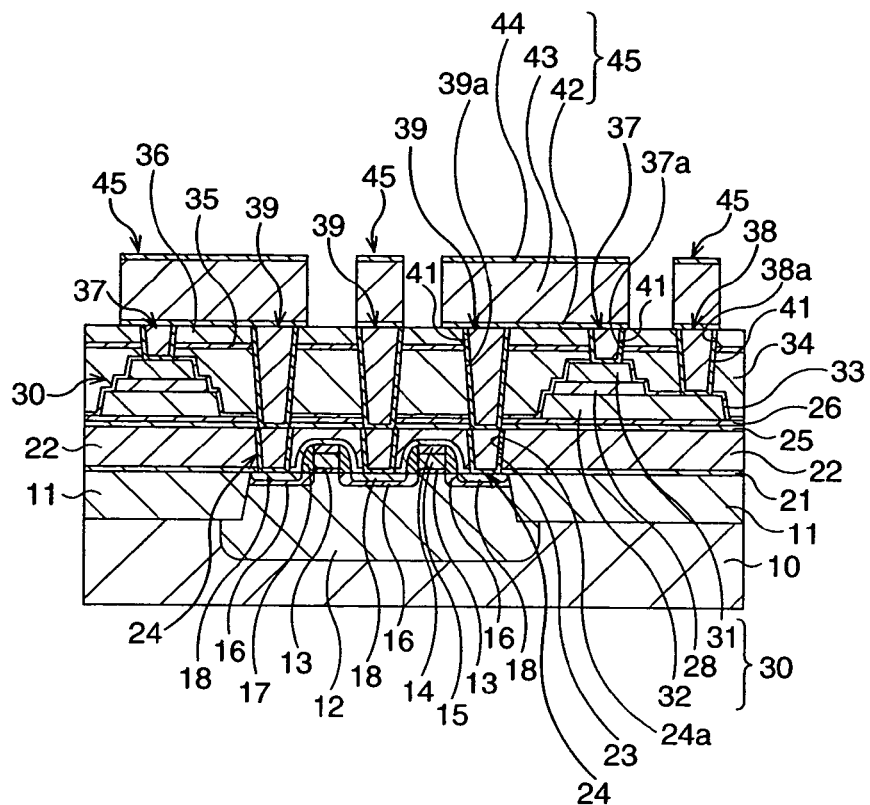
FIGS. 16A and 16B are schematic cross-sectional views showing the fabrication method of the ferro-electric memory of the embodiment in the order corresponding to steps following the FIG. 15D.

Subsequently, as shown in FIG. 16A, a wiring 45, which is connected with the plugs 37, 38 and the second plug 39 respectively, is formed.

Specifically, first, a barrier metal film 42, a wiring film 43 and a barrier metal film 44 are deposited on the whole surface with a sputtering method and the like. As for the barrier metal film 42, for example, a Ti film (film thickness of around 60 nm) and a TiN film (film thickness of around 30 nm) are formed sequentially with a sputtering method. As for the wiring film 43, for example, an Al alloy film (here an Al—Cu film) is formed to a film thickness of around 360 nm. As the barrier metal film 44, for example, a Ti film (film thickness of around 5 nm) and a TiN film (film thickness of around 70 nm) are formed sequentially with a sputtering method. Here, since configuration of the wiring film 43 is determined to the same configuration as a logic section other than FeRAM of the same rule, there is no problem with processing and reliability of the wiring.

Next, after forming, for example, a SiON film (not illustrated) as an antireflection film, the antireflection film, the barrier metal film 44, the wiring film 43 and the barrier metal film 42 are formed into a wiring shape with lithography and subsequent dry etching to pattern a wiring 45. In this connection, instead of forming an Al alloy film as the wiring film 43, a Cu film (or a Cu alloy film) may be formed by utilizing a so-called damascene method to form a Cu wiring as the wiring 45.

Figure 16B:
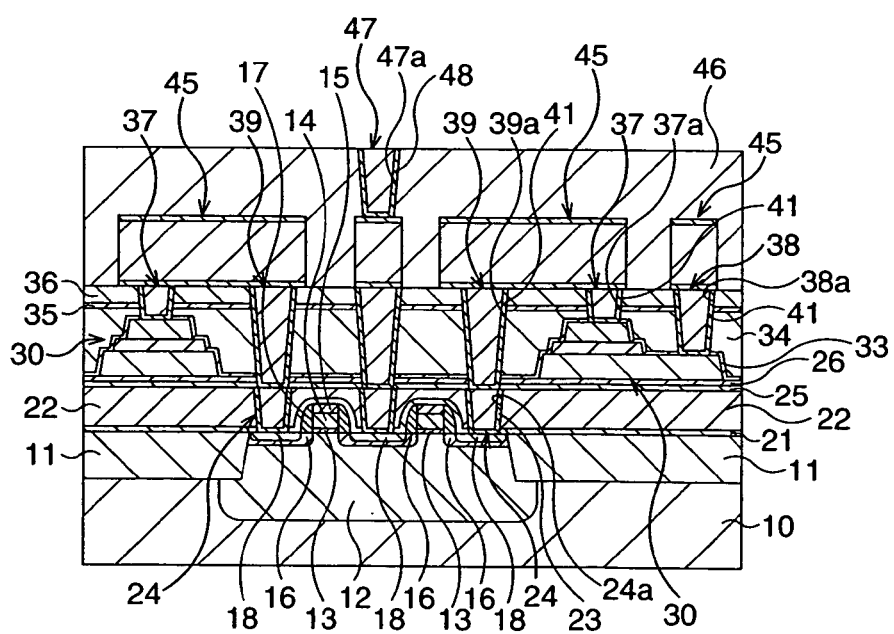

Subsequently, as shown in FIG. 16B, through formation of a third interlayer dielectric film 46 and a third plug 47, and further a wiring layer above them and the like, a FeRAM is completed.

Specifically, first, the third interlayer dielectric film 46 is deposited so as to cover the wiring 45, then the surface thereof is planarized with reflow treatment or the like.

Next, a plug 47 which is connected with the wiring 45 is formed.

The third interlayer dielectric film 46 is processed with lithography and subsequent dry etching until a part of the surface of the wiring 45 is exposed, to form a via hole 47a, for example, having a diameter of about 0.22 μm. Next, after forming a ground film (glue film) 48 so as to cover wall surface of the via hole 47a with a sputtering method, a W film is formed so as to mount the via hole 47a via a glue film 48 with a CVD method. Then, for example, the W film and the glue film 48 are polished while utilizing the third interlayer dielectric film 46 as a stopper, and a plug 47 is formed in which inside of the via hole 47a is mounted with W via the glue film 48.

Then, by repeating steps of forming a wiring, an interlayer dielectric film and a plug for an upper layer, for example, a wiring configuration of 5 layers including the wiring 45 (not illustrated) is formed. After that, a first cover film and a second cover film (not illustrated) are formed. In the example, as the first cover film, for example a HDP-USG film is deposited to a film thickness of around 720 nm and, as the second cover film, for example a silicon nitride film is deposited to a film thickness of around 500 nm, respectively. In addition, after forming a contact for drawing a pad to the wiring configuration of 5 layers, for example, a polyimide film (not illustrated) is formed and patterned to complete the FeRAM of the embodiment.

As explained above, according to the embodiment, it is possible to suppress surface roughness in the upper electrode of the ferro-electric capacitor configuration, and to obtain a FeRAM that realize a highly reliable ferro-electric capacitor configuration, while ensuring superior capacitor characteristics.

According to the invention, it is possible to obtain a semiconductor device whose surface roughness at the upper electrode of a capacitor configuration is suppressed to realize a highly reliable capacitor configuration, while ensuring superior capacitor characteristics.

What is claimed is:

1. A fabricating method of a semiconductor device comprising a semiconductor substrate and a capacitor configuration configured by sandwiching a dielectric film with a lower electrode and an upper electrode formed on the semiconductor device, upon forming the capacitor configuration, comprising: forming a third layer on a first layer via a second layer and patterning the third layer to form the upper electrode; performing a first heat treatment by rapid heating in the state in which the upper electrode has been formed on the second layer which is not patterned yet; performing a second heat treatment with a longer period of time than the first heat treatment after the first heat treatment in the state in which the upper electrode has been formed on the second layer which is not patterned yet; and patterning the second layer to form the dielectric film and the first layer to form the lower electrode after performing the second heat treatment.

2. The fabricating method of the semiconductor device according to claim 1, wherein the upper electrode is formed from a material containing iridium oxide ($IrO_x$).

3. The fabricating method of the semiconductor device according to claim 1, wherein the dielectric film is formed from a material containing lead (Pb).

4. The fabricating method of the semiconductor device according to claim 1, wherein at least the first heat treatment is conducted under an oxygen atmosphere.

5. The fabricating method of the semiconductor device according to claim 1, wherein treatment temperature in the first heat treatment is determined to a value within the range of 400° C. to 1000° C.

6. The fabricating method of the semiconductor device according to claim 1, wherein the upper electrode is formed so as to have crystal diameters of 50 nm or less.

7. The fabricating method of the semiconductor device according to claim 1, wherein the device is configured as a semiconductor chip including plural capacitor configurations, where ratio of an area occupied by plural upper electrodes to a chip area of the semiconductor chip is 6% or less.

8. The fabricating method of the semiconductor device according to claim 1, wherein the second heat treatment is performed at a lower temperature than that in the first heat treatment.

9. The fabricating method of the semiconductor device according to claim 4, wherein an oxygen flow rate in the first heat treatment is determined to a value within the range of 0.1 L/min to 100 L/min.

10. A fabricating method of a semiconductor device comprising a semiconductor substrate and a capacitor configuration configured by sandwiching a dielectric film with a lower electrode and an upper electrode formed on the semiconductor device, upon forming the capacitor configuration, comprising:
forming a third layer on a first layer containing Pb via a second layer and patterning the third layer to form the upper electrode;
performing a first heat treatment by rapid heating using a single-wafer furnace in the state in which the upper electrode has been formed on the second layer and exhausting the Pb volatilized from the second layer from the single-wafer furnace;
performing a second heat treatment with a longer period of time than the first heat treatment using a horizontal furnace after the first heat treatment in the state in which the upper electrode has been formed on the second layer; and
patterning the second layer and the first layer to form the dielectric film and the lower electrode after performing the second heat treatment.

11. The fabricating method of a semiconductor device according to claim 10, wherein said first heat treatment is performed in an atmosphere comprising oxygen.

* * * * *